United States Patent
Wang et al.

(10) Patent No.: US 11,191,175 B2
(45) Date of Patent: Nov. 30, 2021

(54) ELECTRONIC APPARATUS AND BASE MOUNT KIT THEREOF

(71) Applicants: ShenZhen Hongfei Precision Technology Co., Ltd., Shenzhen (CN); HON HAI PRECISION INDUSTRY CO., LTD., New Taipei (TW)

(72) Inventors: Wen-Pin Wang, New Taipei (TW); Li-Wei Chen, New Taipei (TW); Hsueh-Ho Han, New Taipei (TW)

(73) Assignees: ShenZhen Hongfei Precision Technology Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 50 days.

(21) Appl. No.: 16/736,571

(22) Filed: Jan. 7, 2020

(65) Prior Publication Data
US 2020/0221593 A1  Jul. 9, 2020

Related U.S. Application Data

(60) Provisional application No. 62/788,968, filed on Jan. 7, 2019.

(51) Int. Cl.
*H05K 7/02* (2006.01)
*H05K 7/04* (2006.01)
*H05K 5/02* (2006.01)
*H01F 7/02* (2006.01)
*H05K 5/03* (2006.01)

(52) U.S. Cl.
CPC .............. *H05K 5/0217* (2013.01); *H01F 7/02* (2013.01); *H05K 5/03* (2013.01)

(58) Field of Classification Search
USPC ........................................................ 361/807
See application file for complete search history.

(56) References Cited

U.S. PATENT DOCUMENTS

| | | | |
|---|---|---|---|
| 10,004,151 B2 | 6/2018 | Jung et al. | |
| 2013/0303000 A1* | 11/2013 | Witter | F16B 1/00 439/39 |
| 2016/0150861 A1* | 6/2016 | Yao | H04B 1/3888 224/245 |
| 2017/0347477 A1* | 11/2017 | Avital | H05K 5/0247 |
| 2018/0064235 A1* | 3/2018 | Alexander | A45F 5/02 |

FOREIGN PATENT DOCUMENTS

| | | |
|---|---|---|
| CN | 202955440 U | 5/2013 |
| CN | 203702759 U | 7/2014 |
| CN | 204176270 U | 2/2015 |
| CN | 106628217 A | 5/2017 |
| JP | 2007047774 A | 2/2007 |
| TW | I563902 B | 12/2016 |
| TW | I642338 B | 11/2018 |
| WO | 2014186916 A1 | 11/2014 |

* cited by examiner

*Primary Examiner* — Hung S. Bui
(74) *Attorney, Agent, or Firm* — ScienBiziP, P.C.

(57) ABSTRACT

An electronic apparatus has a rear cover and a mount assembly coupled to the rear cover. The mount assembly has a first kit coupled to the rear cover and a second kit removably coupled to the first kit. The first kit has a first mount bracket and a kit rib. The second kit has a second mount bracket corresponding to the first mount bracket and an installation corresponding to the kit rib. When the first kit is rotated relative to the second kit, the rotation of the first kit is restricted by a rib assembly between the kit rib and the installation.

14 Claims, 8 Drawing Sheets

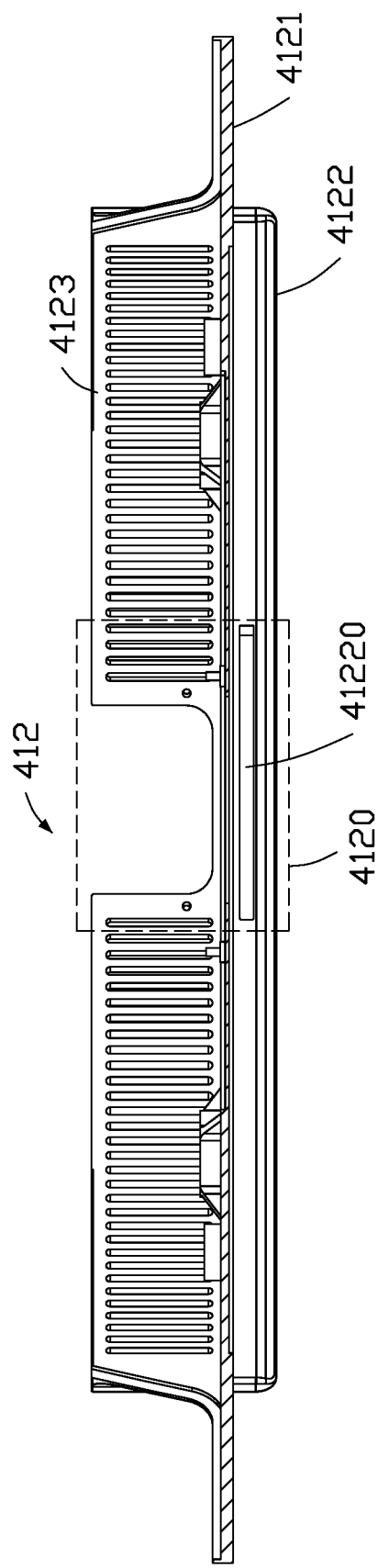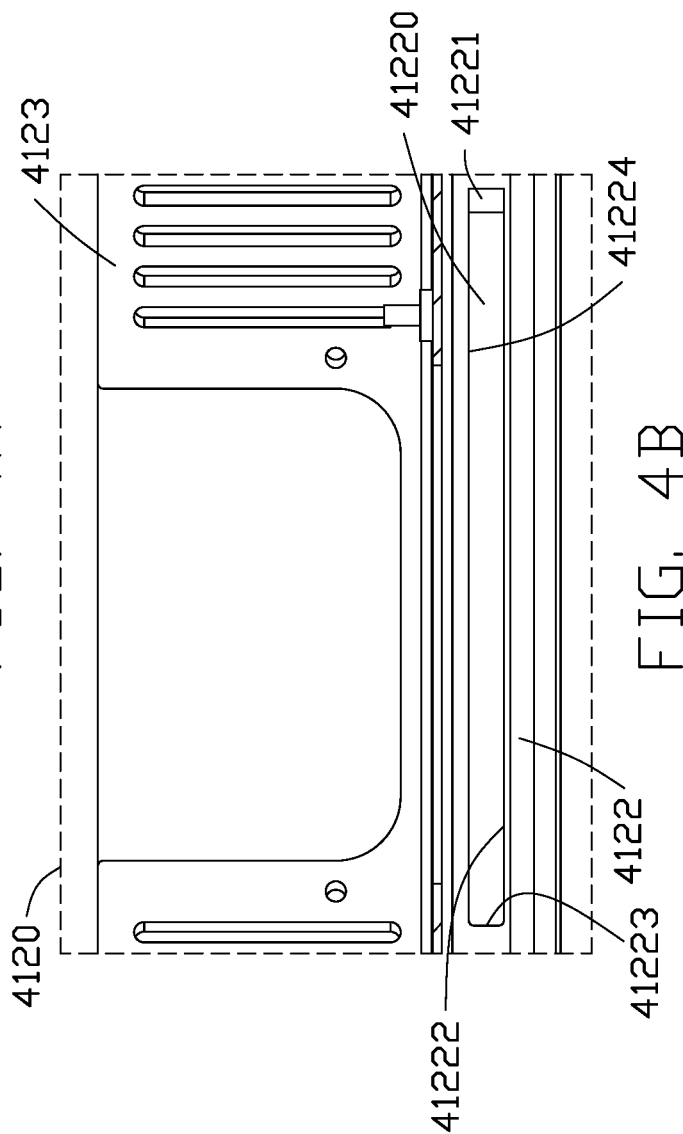
FIG. 4A
FIG. 4B

ELECTRONIC APPARATUS AND BASE MOUNT KIT THEREOF

CROSS-REFERENCE TO RELATED APPLICATION(S)

The present application claims the benefit of and priority to U.S. Provisional Patent Application Ser. No. 62/788,968, filed on Jan. 7, 2019. The contents of U.S. Provisional Patent Application 62/788,968 are hereby incorporated fully by reference into the present application.

FIELD

The present disclosure generally relates to an electronic apparatus including a base mount kit, and a base mount kit for supporting an electronic device.

BACKGROUND

Display panels have been widely used in televisions, laptops, tablets, or other electronics for conveying information, displaying graphics, video, or texts. A display panel may be coupled to a rear cover to form a display device. For the convenience of the viewer, the display device may be coupled to a rack or a mount, and then installed onto a corner, onto a wall, on a desk, or on a flat surface.

The coupling between the rack and the display device is often permanent or semi-permanent: screws and nuts may be required to install or remove the display apparatus from the rack. If the viewer wishes to move the display device to another position or remove the current rack from a wall, a corner, a desk, or a flat surface, this configuration is rather inflexible and inconvenient.

Therefore, there is a need for an assembly that provides removable coupling and sturdy mount between a display device and a rack.

SUMMARY

It is an object of the present disclosure to provide a coupling and releasing mechanism for the display apparatus to be coupled to a rack or a wall.

The present disclosure provides an electronic apparatus. The electronic apparatus comprises a rear cover and a mount assembly coupled to the rear cover. The mount assembly comprises a first kit coupled to the rear cover and comprising a first mount bracket and a kit rib, and a second kit removably coupled to the first kit and comprising a second mount bracket corresponding to the first mount bracket and an installation corresponding to the kit rib. When the first kit is rotated relative to the second kit, the rotation of the first kit is restricted by a rib assembly between the kit rib and the installation.

BRIEF DESCRIPTION OF THE DRAWINGS

Aspects of the exemplary disclosure are best understood from the following detailed description when read with the accompanying figures. Various features are not drawn to scale, dimensions of various features may be arbitrarily increased or reduced for clarity of discussion.

FIG. 4A illustrates a cross-sectional view of the device mount kit along the X-X line in FIG. 3.

FIG. 4B illustrates an enlarged view of the indicated area in FIG. 4A, in accordance with an embodiment of the present disclosure

DETAILED DESCRIPTION

Figure 1:
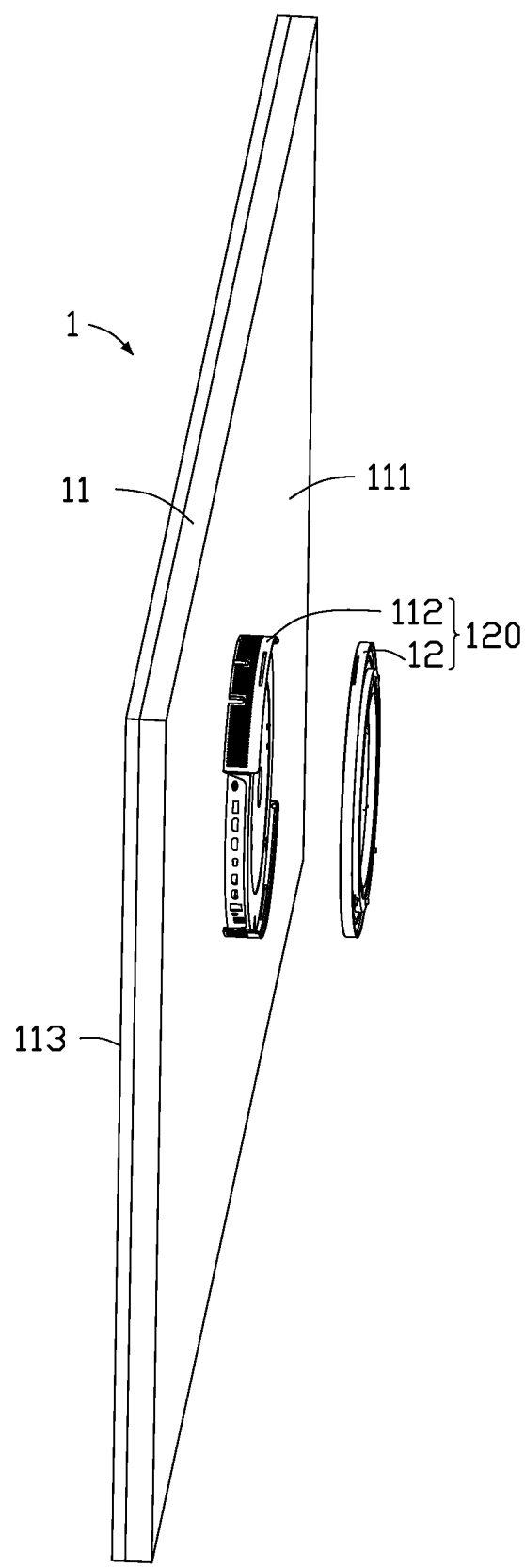
FIG. 1 illustrates a schematic illustration of one exemplary implementation of an electronic apparatus.

The following description contains specific information pertaining to exemplary implementations in the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features are identified (although, in some examples, not shown) by numerals in the exemplary figures. However, the features in different implementations may be differed in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates open-ended inclusion or membership in the so-described combination, group, series and the equivalent.

Additionally, for the purposes of explanation and non-limitation, specific details, such as functional entities, techniques, protocols, standard, and the like are set forth for providing an understanding of the described technology. In other examples, detailed description of well-known methods, technologies, system, architectures, and the like are omitted so as not to obscure the description with unnecessary details.

Persons skilled in the art will immediately recognize that any coding function(s) or algorithm(s) described in the present disclosure may be implemented by hardware, software or a combination of software and hardware. Described functions may correspond to modules may be software, hardware, firmware, or any combination thereof. The software implementation may comprise computer executable instructions stored on computer readable medium such as memory or other type of storage devices. For example, one or more microprocessors or general purpose computers with communication processing capability may be programmed with corresponding executable instructions and carry out the described network function(s) or algorithm(s). The microprocessors or general purpose computers may be formed of applications specific integrated circuitry (ASIC), programmable logic arrays, and/or using one or more digital signal processor (DSPs). Although some of the exemplary implementations described in this specification are oriented to software installed and executing on computer hardware, nevertheless, alternative exemplary implementations implemented as firmware or as hardware or combination of hardware and software are well within the scope of the present disclosure.

FIG. 1 is a schematic illustration of one exemplary implementation of an electronic apparatus. In at least one implementation, an electronic apparatus 1 may include an electronic device 11 and a base mount kit 12. In at least one implementation, the electronic device 11 may include a rear cover 111, a device mount kit 112, and a device module 113. In at least one implementation, the rear cover 111 may cover the device module 113, and the device mount kit 112 may be mounted on the rear cover 111. In at least one implementation, the device mount kit 112 may be removably coupled to the base mount kit 12 to form a mount assembly 120. In other words, the mount assembly 120 may be coupled to the rear cover 111. In at least one implementation, the base mount kit 12 may be mounted on a wall. Thus, the electronic device 11 may be mounted on the wall when the device mount kit 112 is coupled to the base mount kit 12. In at least one implementation, a stand (not shown) may include the base mount kit 12 and be put on a table, a shelf, or a rack. Thus, the electronic device 11 may be installed on the table, the shelf, or the rack when the device mount kit 112 is coupled to the base mount kit 12 of the stand.

In at least one implementation the electronic apparatus 1 may be an equipment having a display panel, when the device module 113 is the display panel coupled to the rear cover 111. In at least one implementation, the electronic apparatus 1 may be a display apparatus.

Figure 2:
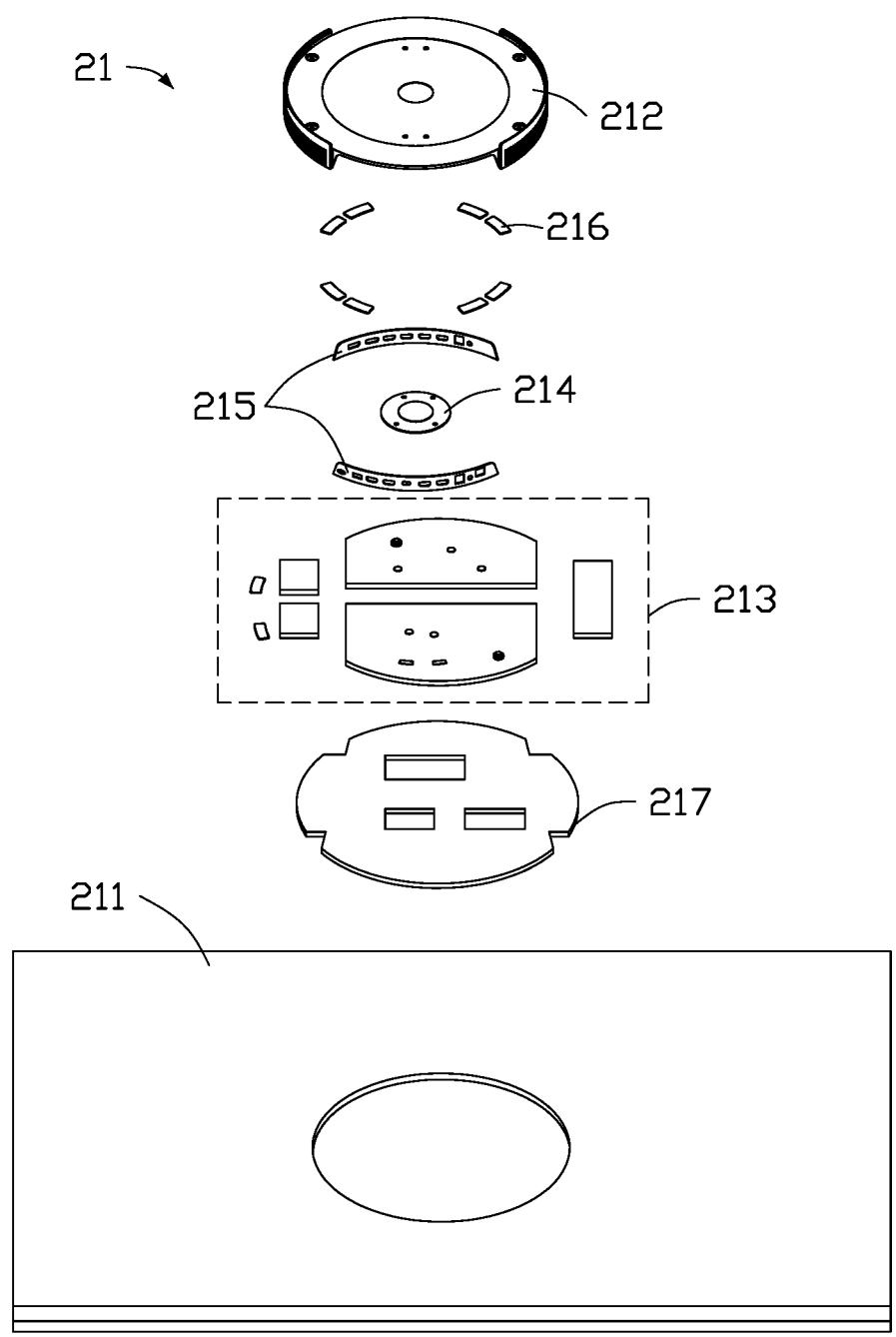
FIG. 2 illustrates an exploded view of an electronic device of the electronic apparatus of FIG. 1, in accordance with an embodiment of the present disclosure.

FIG. 2 illustrates an exploded view of an electronic device of the electronic apparatus 1 of FIG. 1, in accordance with an embodiment of the present disclosure. In at least one implementation, an electronic device 21 may include a rear cover 211, a device mount kit 212, a processing device 213, a connection pin 214, a side cover 215, a plurality of first magnets 216 and a component bracket 217. In at least one implementation, the device mount kit 212 may be mounted on the rear cover 211 to cover the processing device 213, the connection pin 214, the side cover 215, the first magnets 216 and the component bracket 217.

In at least one implementation, referring to FIG. 1, the rear cover 211 may cover on the device module 113. In at least one implementation, the processing device 213 may be coupled to the device module 113 to control the device module 113. In at least one implementation, the processing device 213 may include a board to control the device module 113. In at least one implementation, the connection pin 214 may be coupled to the processing device 213. In at least one implementation, a power supply (not shown) may supply power to the processing device 213 and the device module 113 via the connection pin 214 when the device mount kit 212 is coupled to the base mount kit 12. In at least one implementation, a data provider (not shown) may provide data to the processing device 213 via the connection pin 214 when the device mount kit 212 is coupled to the base mount kit 12. In at least one implementation, the connection pin 214 may be a pogo pin. In at least one implementation, the side cover 215 may include a plurality of connection holes for the electronic device 21 to couple to any other electronic devices via a plurality of connection ports on the processing device 213. In at least one implementation, the side cover 215 may be accommodated by the device mount kit 212. In at least one implementation, the side cover 215 may be integrated into the device mount kit 212, so the device mount kit 212 may include the connection holes. In at least one implementation, the device mount kit 212 may include a plurality of device bracket holes (not shown) for accommodating the first magnets 216. In at least one implementation, the device mount kit 212 may be coupled to the base mount kit 12 via the first magnets 216 of the electronic device 21 and other magnets of the base mount kit 12. In at least one implementation, the component bracket 217 may be mounted on the rear cover 211, and the processing device 213 and the connection pin 214 may be mounted on the component bracket 217.

Figure 3:
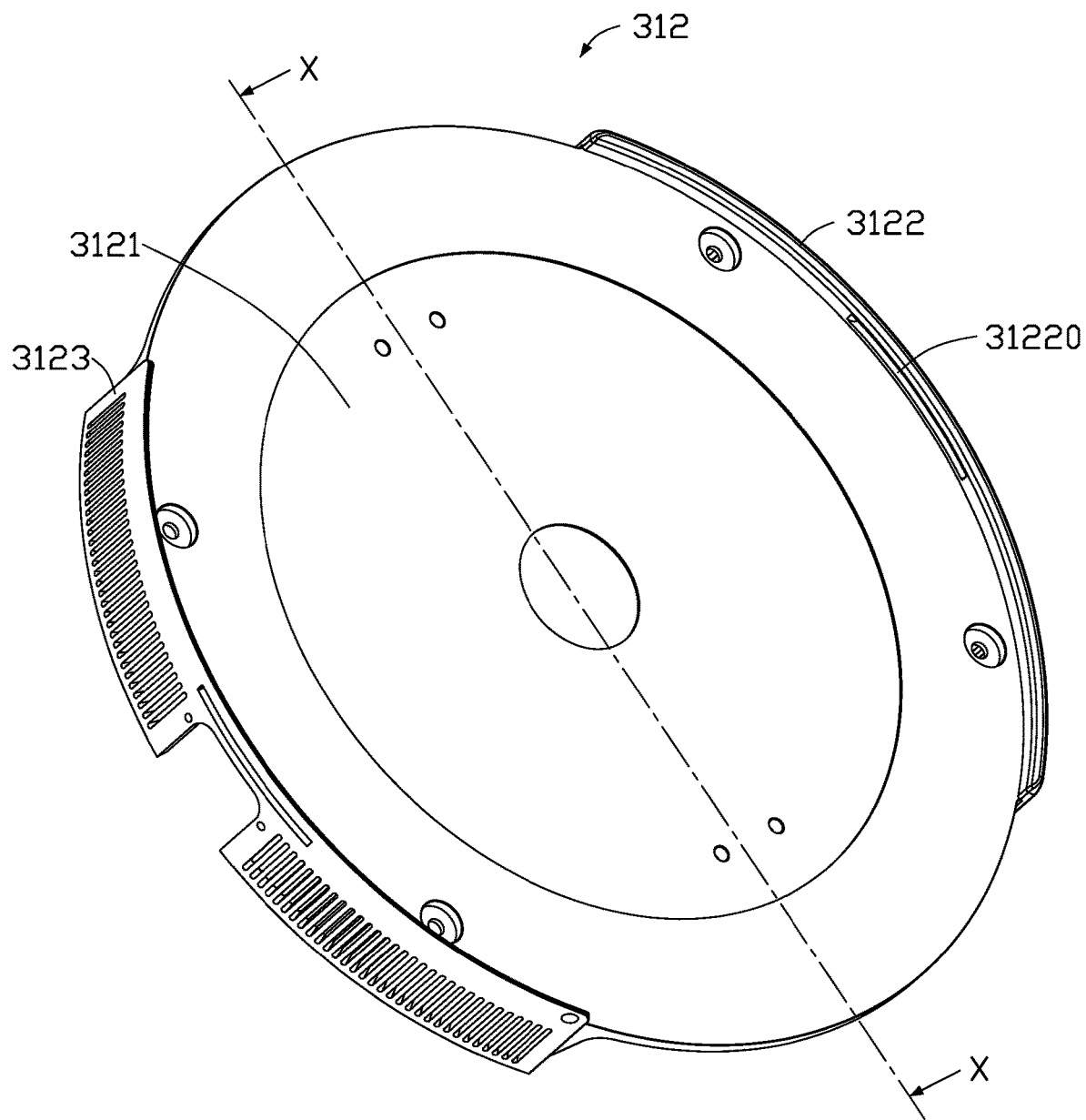
FIG. 3 illustrates a perspective view of a device mount kit of the electronic device of FIG. 2, in accordance with an embodiment of the present disclosure.

FIG. 3 illustrates a perspective view of a device mount kit of the electronic device of FIG. 2, in accordance with an embodiment of the present disclosure. In at least one implementation, a device mount kit 312 may include a device mount bracket 3121, a kit rib 3122, and a device mount enclosure 3123. In at least one implementation, referring to FIG. 1, the kit rib 3122 may protrude from the device mount bracket 3121 to accommodate the base mount kit 12. In at least one implementation, the kit rib 3122 may be perpendicular to the device mount bracket 3121. In at least one implementation, the device mount enclosure 3123 may protrude from the device mount bracket 3121. In at least one implementation, referring to FIG. 2, the device mount enclosure 3123 may protrude from the device mount bracket 3121 to cover the processing device 213, the connection pin 214, the side cover 215 and the component bracket 217. In at least one implementation, the device mount bracket 3121 may include two different surfaces. When the kit rib 3122 protrudes from one of the two surfaces in the device mount bracket 3121, the device mount enclosure 3123 may protrude from the other of the two surfaces in the device mount bracket 3121. In at least one implementation, a first intersection between the device mount bracket 3121 and the kit rib 3122 may correspond to a second intersection between the device mount bracket 3121 and the device mount enclosure 3123. In one implementation, the first intersection may be identical to the second intersection. In at least one implementation, the first intersection may be different from the second intersection. In at least one implementation, the kit rib 3122 may include a rib recess 31220 for accommodating an installation of the base mount kit 12.

FIG. 4A illustrates a cross-sectional view of the device mount kit along the X-X line in FIG. 3. FIG. 4B illustrates an enlarged view of an indicated area 4120 in FIG. 4A, in accordance with an embodiment of the present disclosure. In at least one implementation, a device mount kit 412 may include a device mount bracket 4121, a kit rib 4122, and a device mount enclosure 4123. In at least one implementation, the kit rib 4122 may protrude vertically from the device mount bracket 4121, and the device mount enclosure 4123 may protrude vertically from the device mount bracket 4121. In at least one implementation, the device mount bracket 4121 may include two different surfaces. When the kit rib 4122 protrudes from one of the two surfaces in the device mount bracket 4121, the device mount enclosure 4123 may protrude from the other of the two surfaces in the device mount bracket 4121. In at least one implementation, the kit rib 4122 may include a rib recess 41220 having a plurality of recess walls. In at least one implementation, the recess walls may include a first recess wall 41221, a second recess wall 41222, a third recess wall 41223, and a fourth recess wall 41224. In at least one implementation, the first recess wall 41221 may be an inclined wall. In at least one implementation, each of the second recess wall 41222, the third recess wall 41223 and the fourth recess wall 41224 may be a vertical wall. Thus, the first recess wall 41221 may be different from the other recess walls. In other implementations, the fourth recess wall 41224 may also be an inclined wall.

Figure 5A:
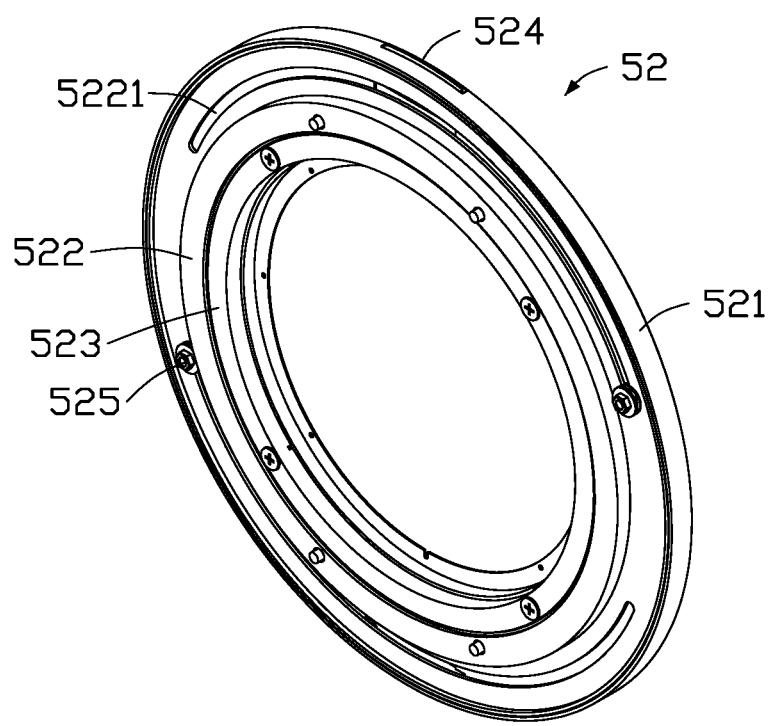
FIGS. 5A and 5B illustrate two perspective views of a base mount kit of the electronic apparatus of FIG. 1, in accordance with an embodiment of the present disclosure.
Figure 5B:
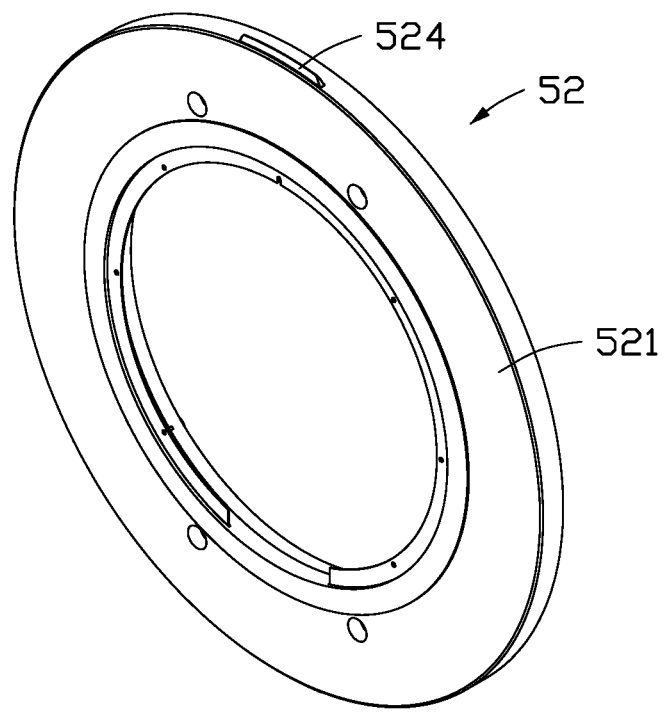

FIGS. 5A and 5B illustrate two perspective views of the base mount kit of the electronic apparatus 1 of FIG. 1, in accordance with an embodiment of the present disclosure. In at least one implementation, a base mount kit 52 may include a base mount bracket 521, a brake unit 522, a rotation unit 523, an installation 524, and a moving fastener 525. In at least one implementation, the brake unit 522 is coupled to the base mount bracket 521 to cover the rotation unit 523 and the installation 524. In at least one implementation, the brake unit 522 may include a fastener channel 5221 for the moving fastener 525. In at least on implementation, the moving fastener 525 may be movable along the fastener channel 5221 on the brake unit 522. In at least one implementation, referring to FIG. 3, the base mount bracket 521 may correspond to the device mount bracket 3121, and the installation 524 may correspond to the kit rib 3122, when the base mount kit 52 is coupled to the device mount kit 312. In at least one implementation, the installation 524 may be removably coupled to the rib recess 31220 and protrude from the base mount bracket 521.

In at least one implementation, referring to FIG. 3, the device mount kit 312 may have a first diameter, and the base mount kit 52 may have a second diameter smaller than the first diameter. In at least one implementation, the kit rib 3122 may protrude from the device mount kit 312 to determine a third diameter. In the embodiment, the third diameter is smaller than the first diameter. In at least one implementation, the third diameter may be equal to a fourth diameter of the device mount bracket 3121. In at least one implementation, the third diameter may be equal to or greater than the second diameter of the base mount kit 52 for accommodating the base mount kit 52 by the device mount kit 312.

Figure 6:
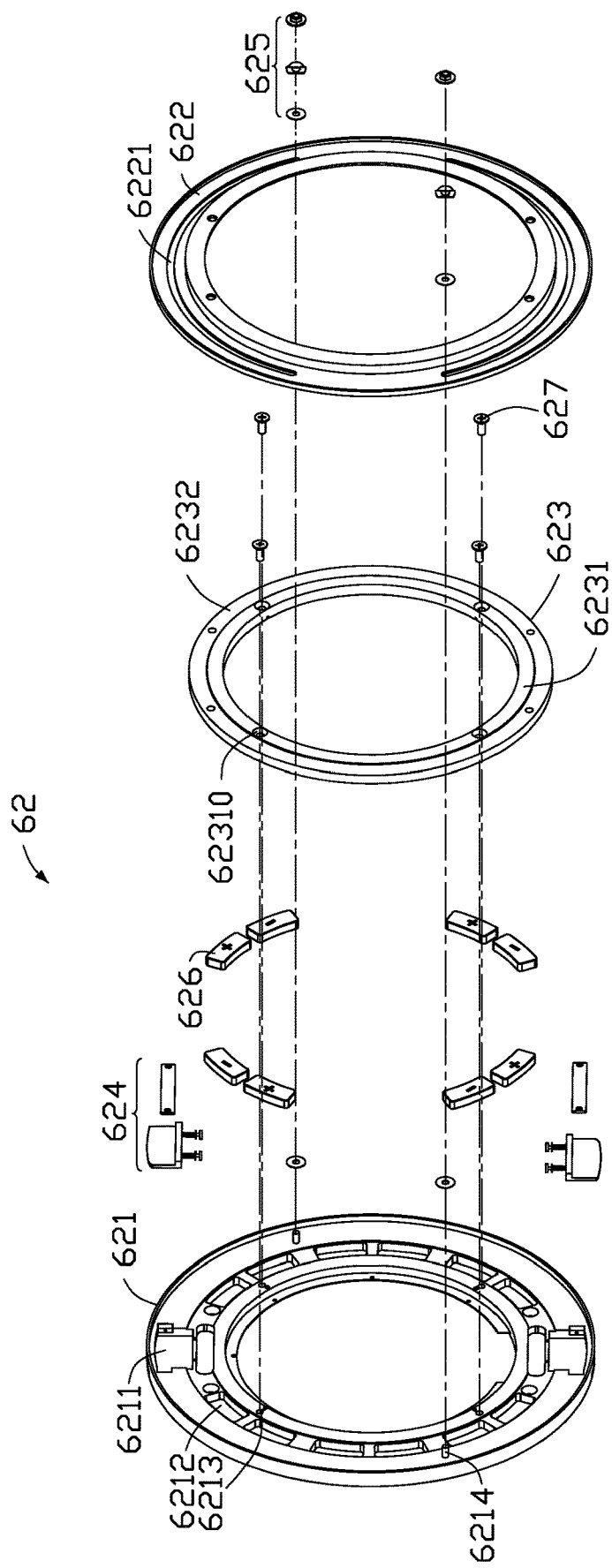
FIG. 6 illustrates an exploded view of the base mount kit of FIG. 5A, in accordance with an embodiment of the present disclosure.

FIG. 6 illustrates an exploded view of the base mount kit of FIG. 5A, in accordance with an embodiment of the present disclosure. In at least one implementation, a base mount kit 62 may include a base mount bracket 621, a brake unit 622, a rotation unit 623, an installation 624, a moving fastener 625, a plurality of second magnets 626, and a mounting pin 627. In at least one implementation, the base mount bracket 621 may include a first bracket hole 6211, a plurality of second bracket holes 6212, a third bracket hole 6213, and a bracket pillar 6214. In at least one implementation, the first bracket hole 6211 may accommodate the installation 624, the second bracket holes 6212 may accommodate the second magnets 626. In at least one implementation, the second bracket holes 6212 may be a plurality of circularly arranged trenches surrounded by the installation 624. In at least one implementation, the brake unit 622 may be a rotation brake. In at least one implementation, the brake unit 622 may be coupled to the base mount bracket 621 via the moving fastener 625. In at least one implementation, the brake unit 622 may include a fastener channel 6221 for the moving fastener 625. In at least on implementation, the moving fastener 625 may be movable along the fastener channel 6221 on the brake unit 622. In at least one implementation, the rotation unit 623 may be a rotation bearing. In at least one implementation, the rotation unit 623 may be sandwiched between the brake unit 622 and the base mount bracket 621 and coupled to the base mount bracket 621. In at least one implementation, the rotation unit 623 may include an inner ring 6231 and an outer ring 6232. In at least one implementation, the inner ring 6231 may include a ring hole 62310. In at least one implementation, the inner ring 6231 may be mounted on the base mount bracket 621 by the mounting pin 627 through the ring hole 62310 and the third bracket hole 6213. In at least one implementation, the base mount bracket 621 may be rotated together with the inner ring 6231 via the mounting pin 627, when the brake unit 622 and the outer ring 6232 are mounted together on the wall via a wall pin (not shown). In at least one implementation, the moving fastener 625 may be installed on the base mount bracket 621 through the fastener channel 6221 and the bracket pillar 6214. Thus, the moving fastener 625 installed on the bracket pillar 6214 may be moved along the fastener channel 6221 when the base mount bracket 621 and the inner ring 6231 are rotated together relative to the outer ring 6232 and the brake unit 622. Referring to FIG. 1, the electronic device 11 may be rotated with the base mount bracket 621 when the electronic device 11 is mounted on the base mount bracket 621 of the base mount kit 62.

In at least one implementation, the fastener channel 6221 may restrict a moving path of the moving fastener 625, so the rotation of the base mount bracket 621 and the inner ring 6231 may be restricted by the moving path of the moving fastener 625. In at least one implementation, the fastener channel 6221 may be a curved channel. In at least one implementation, a central angle of the curved channel may be equal to or greater than 90°. Thus, a device orientation of the electronic device 11 may be changed between a horizontal orientation and a vertical orientation when the electronic device 11 is rotated with the base mount bracket 621.

In at least on implementation, referring to FIG. 3, the installation 624 may be removably coupled to the kit rib 3122. Thus, the installation 624 may be removably coupled to the rib recess 31220 of the kit rib 3122 when the base mount kit 62 is coupled to the device mount bracket 3121. In at least one implementation, the moving fastener 625 may include a plane washer, a spring washer, a screw nut. In at least one implementation, the screw nut may be mounted on the bracket pillar 6214. In at least one implementation, referring to FIG. 2, the base mount kit 62 may be coupled to the electronic device 21 via the second magnets 626 of the base mount kit 62 and the first magnets 216 of the electronic device 21. In at least one implementation, the second magnets 626 may be mounted to correspond to the first magnets 216.

In at least one implementation, referring to FIGS. 2 and 6, the first magnets 216 may be positioned to face with the second magnets 626. In at least one implementation, the first magnets 216 may include a first magnet component and a second magnet component adjacent to the first magnet component, and the second magnets 626 may include a third magnet component and the fourth magnet component adjacent to the third magnet component. In at least one implementation, the magnetism of the first magnet component may be opposite to the magnetism of the second magnet component, and the magnetism of the third magnet component may be opposite to the magnetism of the fourth magnet component. In at least implementation, the first magnet component may be positioned to face with the third magnet component, and the second magnet component may be positioned to face with the fourth magnet component. In the implementation, the base mount kit 62 may be coupled to the device mount kit 212 by magnetic attraction, since the magnetism of the first magnet component may be opposite to the magnetism of the third magnet component, and the magnetism of the second magnet component may be opposite to the magnetism of the fourth magnet component. In addition, the first magnet component may be rotated to face with the fourth magnet component when the electronic device 21 is rotated, since the second magnets 626 are accommodated by the circularly arranged trenches and the first magnets 216 are installed to correspond to the second magnets 626. Thus, the electronic device 21 may be separated from the base mount kit 62 by magnetic repulsion between the first magnet component and the fourth magnet component.

Figure 7A:
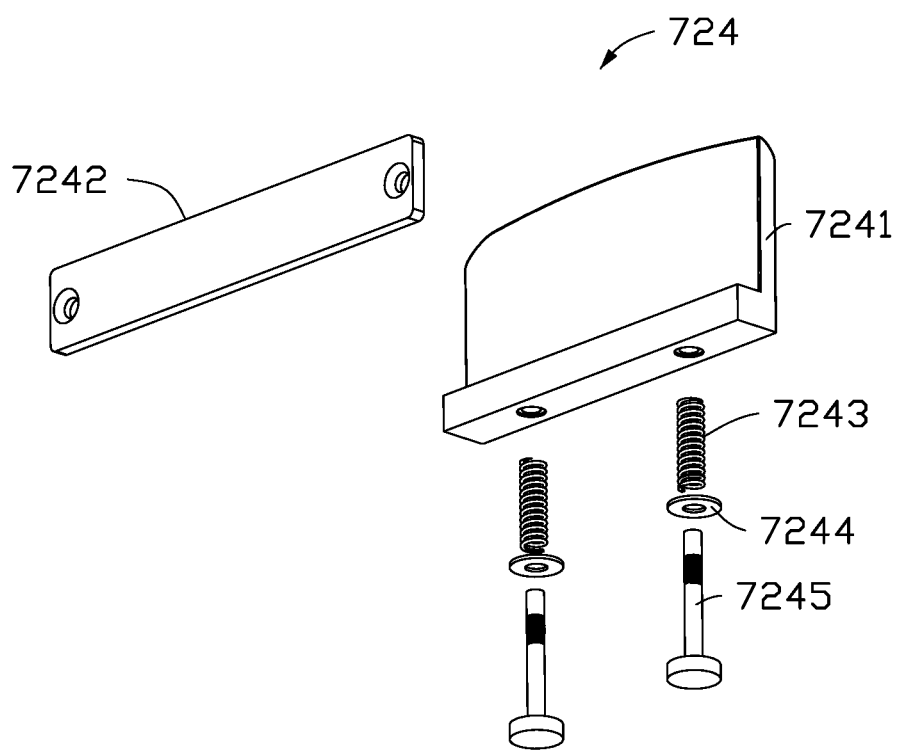
FIG. 7A illustrates an exploded view of the installation of FIG. 6.
Figure 7B:
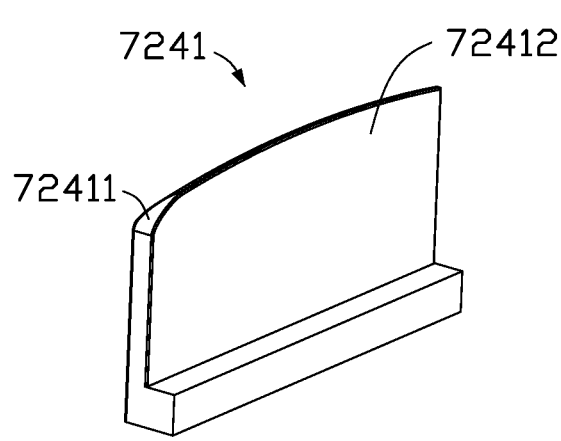
FIGS. 7B and 7C illustrate two perspective views of a protruded pin of the installation of FIG. 7A, in accordance with an embodiment of the present disclosure.
Figure 7C:
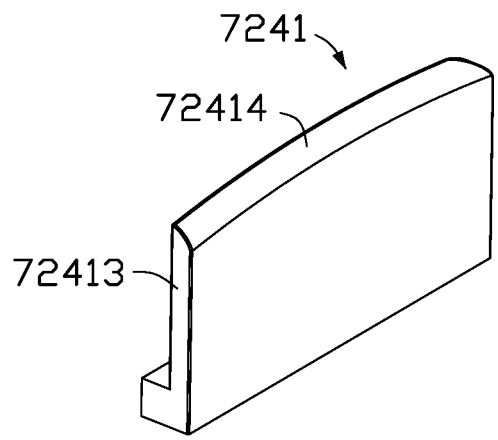

FIG. 7A illustrates an exploded view of the installation of FIG. 6, in accordance with an embodiment of the present disclosure. In at least one implementation, an installation 724 may include a protruded pin 7241, a pin cover 7242, a pin spring 7243, a pin washer 7244, and a pin fastener 7245. In at least one implementation, the pin spring 7243 and the pin washer 7244 may be mounted on the protruded pin 7241 via the pin fastener 7245. In at least one implementation, referring to FIG. 6, the protruded pin 7241 may be installed into the first bracket hole 6211 via the pin cover 7242. In at least one implementation, the protruded pin 7241 may protrude from the base mount bracket 621. In at least one implementation, the protruded pin 7241 may be moved toward the center of the base mount kit 62 due to an external pressure since the pin spring 7243 is included in the installation 724. FIGS. 7B and 7C illustrate two perspective views of a protruded pin of the installation of FIG. 7A, in accordance with an embodiment of the present disclosure. In at least one implementation, the protruded pin 7241 may include a plurality of pin walls. In at least one implementation, the pin walls may include a first pin wall 72411, a second pin wall 72412, a third pin wall 72413, and a fourth pin wall 72414. In at least one implementation, the first pin wall 72411 and the fourth pin wall 72414 may be inclined walls and the second pin wall 72412 and the third pin wall 72413 may be vertical walls. In at least one implementation, the first pin wall 72411 may be inclined toward the third pin wall 72413, and the fourth pin wall 72414 may be inclined toward the second pin wall 72412. In the implementation, a first inclined direction of the first pin wall 72411 is different from a second inclined direction of the fourth pin wall 72414. Thus, the first pin wall 72411 may be different from the other pin walls. In other implementations, the fourth pin wall 72414 may also be a vertical wall. Referring to FIG. 4B, the first pin wall 72411 may be structurally complementary to and correspond to the first recess wall 41221, the second pin wall 72412 may be structurally complementary to and correspond to the second recess wall 41222, the third pin wall 72413 may be structurally complementary to and correspond to the third recess wall 41223, and the fourth pin wall 72414 may be structurally complementary to and correspond to the fourth recess wall 41224.

Figure 8:
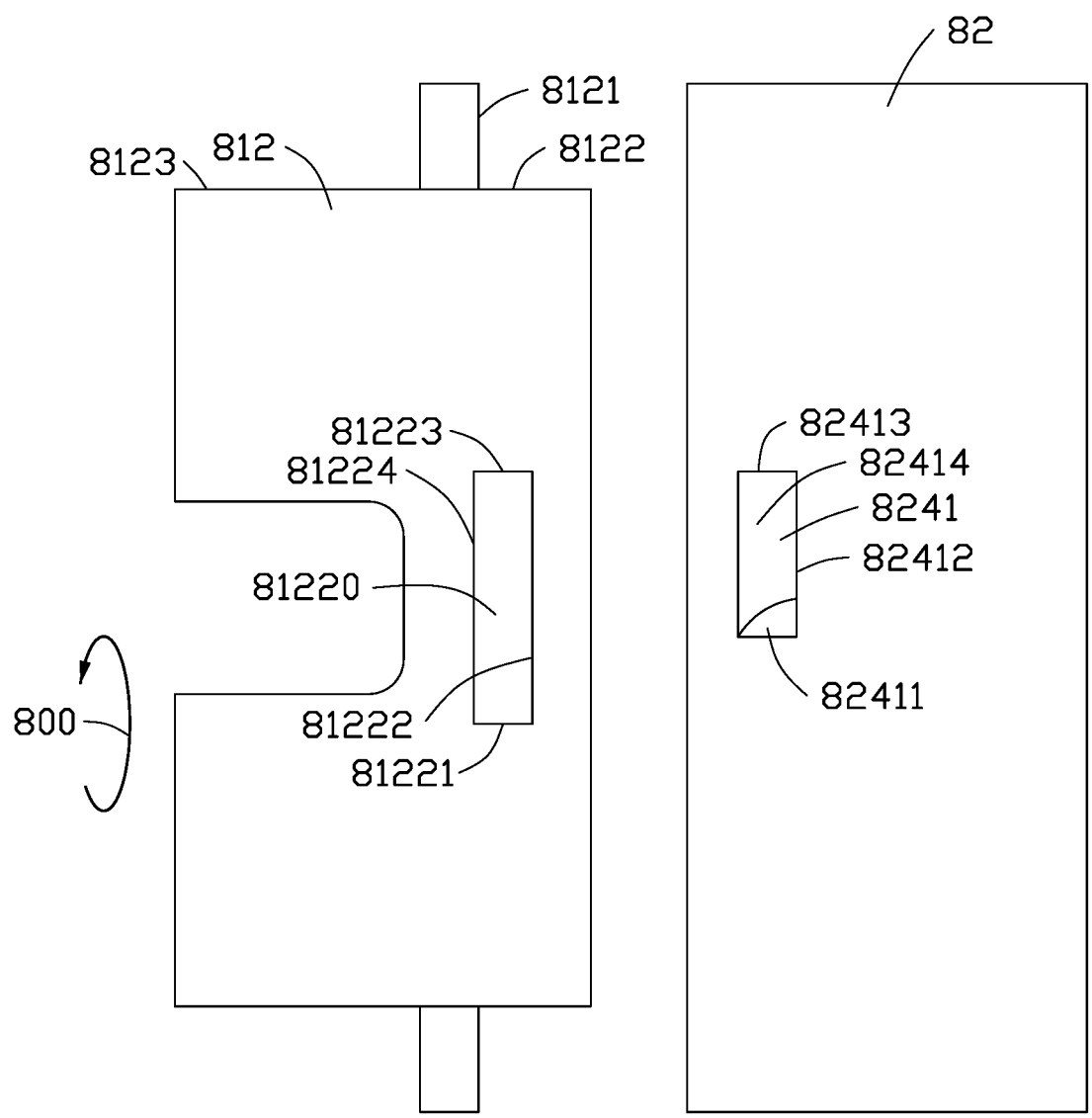
FIG. 8 is a schematic illustration of a top view of a mount assembly between the device mount kit and the base mount kit of the electronic apparatus of FIG. 1, in accordance with an embodiment of the present disclosure.

FIG. 8 is a schematic illustration of a top view of a mount assembly between the device mount kit and the base mount kit of the electronic apparatus of FIG. 1, in accordance with an embodiment of the present disclosure. In at least one implementation, a device mount kit 812 may include a device mount bracket 8121, a kit rib 8122 and a device mount enclosure 8123. In at least one implementation, the kit rib 8122 and the device mount enclosure 8123 may be integrated into a single element. In at least one implementation, the kit rib 8122 may include a rib recess 81220, and a base mount kit 82 may include an installation 824 having a protruded pin 8241 removably coupled to the rib recess 81220. In at least one implementation, the protruded pin 8241 may be inserted into the rib recess 81220 when the device mount kit 812 is assembled with the base mount kit 82. In at least one implementation, each of the second recess wall 81222, the third recess wall 81223, the fourth recess wall 81224, the second pin wall 82412 and the third pin wall 82413 is a vertical wall, and each of the first recess wall 81221, the first pin wall 82411, and the fourth pin wall 82414 is an inclined wall.

In at least one implementation, a first length of the rib recess 81220 may be greater than a second length of the protruded pin 8241. Thus, a length difference between the first length and the second length provides space for a relative rotation between the device mount kit 812 and the base mount kit 82. In at least one implementation, the base mount kit 82 may be mounted on the wall. Thus, referring to FIG. 1, the device mount kit 812 may be rotated along a counterclockwise direction 800 when the device mount kit 812 is rotated to separate the electronic device 11 from the base mount kit 82. In the implementation, the first recess wall 81221 may be rotated to be close to the first pin wall 82411. In at least one implementation, the protruded pin 8241 may be pressed by the rib recess 81220 when the first recess wall 81221 is in contact with the first pin wall 82411, since the first pin wall 82411 is the inclined wall. Thus, the electronic device 11 may be decoupled from the base mount kit 82.

In at least one implementation, referring to FIGS. 2 and 6, the length difference may be determined based on a distance between the first magnets 216 or between the second magnets 626. In at least one implementation, the length difference may be long enough to make one of the first magnets 216 to be close to one of the second magnets 626 having identical magnetisms, so the magnetic repulsion is greater than the magnetic attraction for separating the electronic device 21 from the base mount kit 62.

In at least one implementation, there are two rotation modes in the electronic apparatus. In at least one implementation, referring to FIGS. 1, 5 and 8, the electronic device 11 may be rotated to decouple from the base mount kit 82 in a first rotation mode. In at least one implementation, the protruded pin 8241 may prevent the device mount kit 812 from rotating in a clockwise direction since the third recess wall 81223 and the third pin wall 82413 are the vertical walls. Thus, in the first rotation mode, the rotation of the electronic device 11 may be rotated only in the counterclockwise direction 800 to separate the device mount kit 812 from the base mount kit 82. In the implementation, the rotation of the device mount kit 812 is restricted by a rib assembly between the kit rib 8122 and the installation 524 when the device mount kit 812 is rotated relative to the base mount kit 82.

In at least one implementation, referring to FIG. 6, the base mount bracket 621 may be rotated to change the orientation of the electronic device 11 via the rotation unit 623 in a second rotation mode. In the implementation, the base mount bracket 621 may be rotated in the clockwise direction or the counterclockwise direction along the fastener channel 6221.

In at least one implementation, referring to FIGS. 1, 6 and 8, the first rotation mode may not be initialized due to the two vertical walls of the third recess wall 81223 and the third pin wall 82413, when a user tries to rotate the electronic device 11 in the clockwise direction. However, the second rotation mode may be initialized to adjust the orientation of the electronic device 11, when the user tries to rotate the electronic device 11 in the clockwise direction. In at least one implementation, one of the first rotation mode and the second rotation mode may be initialized when the user tries to rotate the electronic device 11 in the counterclockwise direction. Since the magnetic attraction between the first magnets and the second magnets is greater than a friction between the moving fastener 625 and the brake unit 622, the second rotation mode may be initialized prior to the initialization of the first rotation mode. Thus, the orientation of the electronic device 11 may be first adjusted along the counterclockwise direction. Then, the second rotation mode may be stopped by the fastener channel 6221 when the moving fastener 625 is moved to a terminal of the fastener channel 6221. In the implementation, the first rotation mode may be initialized to separate the electronic device 11 from the base mount kit 62 when the user still tries to rotate the electronic device 11 in the counterclockwise direction. In at least one implementation, the orientation of the electronic device 11 may be horizontal, when the moving fastener 625 is located at the terminal of the fastener channel 6221. Thus, the electronic device 11 may be separated from the base mount kit 62 through the counterclockwise direction in the first rotation mode when the orientation of the electronic device 11 is horizontal. In addition, the electronic device 11 may be rotated to adjust the orientation to be horizontal through the counterclockwise direction in the second rotation mode and then be separated from the base mount kit 62 through the counterclockwise direction in the first rotation mode, when the orientation of the electronic device 11 is vertical.

In at least one implementation, the protruded pin 8241 may prevent the device mount kit 812 from rotating in the counterclockwise direction in the first rotation mode when the first recess wall 81221 and the first pin wall 82411 are the vertical walls and the third recess wall 81223 is an inclined wall. In the implementation, in the first rotation mode, the electronic device 11 may be rotated only in the clockwise direction to separate the device mount kit 112 from the base mount kit 12. Thus, the electronic device 11 may be separated from the base mount kit 62 through the clockwise direction in the first rotation mode when the orientation of the electronic device 11 is horizontal. In addition, the electronic device 11 may be rotated to adjust the orientation to be horizontal through the clockwise direction in the second rotation mode and then be separated from the base mount kit 62 through the clockwise direction in the first rotation mode, when the orientation of the electronic device 11 is vertical.

From the above description, it is manifest that various techniques may be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. An electronic apparatus comprising:
a rear cover; and
a mount assembly coupled to the rear cover, the mount assembly comprising:
a first kit coupled to the rear cover and comprising a first mount bracket and a kit rib; and
a second kit removably coupled to the first kit and comprising:
a second mount bracket corresponding to the first mount bracket;
a brake unit coupled to the second mount bracket via a moving fastener and having a fastener channel for the moving fastener;
a rotation unit sandwiched between the brake unit and the second mount bracket and coupled to the second mount bracket; and
an installation corresponding to the kit rib,
wherein, when the first kit is rotated relative to the second kit, the rotation of the first kit is restricted by a rib assembly between the kit rib and the installation.

2. The electronic apparatus of claim 1, wherein the kit rib includes a rib recess removably coupled to the installation and having a plurality of recess walls, and one of the plurality of recess walls has a first inclined wall different from other ones of the plurality of recess walls.

3. The electronic apparatus of claim 2, wherein the installation includes a protruded pin removably coupled to the rib recess, protruding from the second mount bracket and having a plurality of pin walls, and one of the plurality of pin walls has a second inclined wall different from other ones of the plurality of pin walls and corresponding to the first inclined wall.

4. The electronic apparatus of claim 1, wherein the first mount kit has a first diameter, and the first diameter is greater than a second diameter of the second mount bracket.

5. The electronic apparatus of claim 4, wherein the kit rib vertically protrudes from the first mount bracket to determine a third diameter which is smaller than the first diameter, and the third diameter is equal to or greater than the second diameter for accommodating the second mount bracket by the first kit.

6. The electronic apparatus of claim 1, wherein the second kit includes a plurality of circularly arranged trenches surrounded by the installation and accommodating a plurality of second magnets, and the first kit includes a plurality of first magnets corresponding to the second magnets.

7. The electronic apparatus of claim 1, wherein the rotation unit further comprises:
an outer ring mounted on the brake unit; and
an inner ring mounted on the second mount bracket via a mounting pin, wherein the moving fastener is moved along the fastener channel when the inner ring and the second mount bracket are rotated relative to the outer ring and the brake unit.

8. The electronic apparatus of claim 1, wherein the fastener channel is a curved channel, and a central angle of the curved channel is equal to or greater than 90°.

9. A base mount kit to mount an electronic device, the base mount kit comprising:
a base mount bracket corresponding to a device mount bracket of a device mount kit on the electronic device;
a brake unit coupled to the base mount bracket via a moving fastener and having a fastener channel for the moving fastener;
a rotation unit sandwiched between the brake unit and the base mount bracket and coupled to the base mount bracket; and an installation corresponding to a kit rib protruding from the device mount bracket;

wherein, when the device mount kit is rotated relative to the base mount kit, the rotation of the device mount kit is restricted by a rib assembly between the kit rib and the installation.

10. The base mount kit of claim 9, wherein the kit rib includes a rib recess removably coupled to the installation and having a plurality of recess walls, and one of the plurality of recess walls has a first inclined wall different from other ones of the plurality of recess walls.

11. The base mount kit of claim 10, wherein the installation includes a protruded pin removably coupled to the rib recess and having a plurality of pin walls, and one of the plurality of pin walls has a second inclined wall different from other ones of the plurality of pin walls and corresponding to the first inclined wall.

12. The base mount kit of claim 9, wherein the device mount kit has a first diameter greater than a second diameter of the base mount bracket, and a third diameter determined based on the kit rib is equal to or greater than the second diameter for accommodating the base mount bracket by the device mount kit.

13. The base mount kit of claim 9, wherein the rotation unit comprises:
   an outer ring mounted on the brake unit; and
   an inner ring mounted on the base mount bracket via a mounting pin, wherein the moving fastener is moved along the fastener channel when the inner ring and the base mount bracket are rotated relative to the outer ring and the brake unit.

14. The base mount kit of claim 9, wherein the fastener channel is a curved channel, and a central angle of the curved channel is equal to or greater than 90°.

* * * * *